US011388828B2

(12) United States Patent
Mizoguchi et al.

(10) Patent No.: US 11,388,828 B2
(45) Date of Patent: Jul. 12, 2022

(54) CHASSIS MEMBER, ELECTRONIC DEVICE, AND METHOD FOR MANUFACTURING THE CHASSIS MEMBER

(71) Applicant: LENOVO (SINGAPORE) PTE. LTD., Singapore (SG)

(72) Inventors: Fumitake Mizoguchi, Yokohama (JP); Seita Horikoshi, Yokohama (JP); Kazuya Umejima, Yokohama (JP); Takayuki Morino, Yokohama (JP)

(73) Assignee: LENOVO (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 17/183,541

(22) Filed: Feb. 24, 2021

(65) Prior Publication Data

US 2021/0315119 A1 Oct. 7, 2021

(30) Foreign Application Priority Data

Apr. 3, 2020 (JP) .............................. JP2020-067274

(51) Int. Cl.
*H05K 7/00* (2006.01)
*H05K 7/04* (2006.01)
*H05K 7/14* (2006.01)

(52) U.S. Cl.
CPC .............. *H05K 7/04* (2013.01); *H05K 7/1427* (2013.01)

(58) Field of Classification Search
CPC ...... H05K 7/04; H05K 7/1427; G06F 1/1616; G06F 1/1637; G06F 1/1681; G06F 1/1656
See application file for complete search history.

(56) References Cited

U.S. PATENT DOCUMENTS

| | | | | |
|---|---|---|---|---|
| 5,001,659 A | * | 3/1991 | Watabe | G06F 1/1681 361/679.28 |
| 5,390,075 A | * | 2/1995 | English | G06F 1/1681 174/136 |
| 5,754,395 A | * | 5/1998 | Hsu | G06F 1/1667 400/682 |
| 6,151,207 A | * | 11/2000 | Kim | G06F 1/1637 361/679.57 |
| 6,512,670 B1 | * | 1/2003 | Boehme | G06F 1/1683 348/E5.025 |
| 6,747,713 B1 | * | 6/2004 | Sato | G06F 1/1616 361/679.4 |
| 7,343,645 B2 | * | 3/2008 | Li | H01R 35/00 16/258 |
| 7,403,377 B2 | * | 7/2008 | Deluga | G06F 1/1637 361/679.55 |

(Continued)

FOREIGN PATENT DOCUMENTS

| | | |
|---|---|---|
| JP | 2016139653 A | 8/2016 |
| JP | 2018085404 A | 5/2018 |
| JP | 2019059105 A | 4/2019 |

*Primary Examiner* — Rockshana D Chowdhury
(74) *Attorney, Agent, or Firm* — Shimokaji IP (57) ABSTRACT

A chassis member is used for an electronic device, including a face plate, and a frame to be fixed to one face of the face plate and provided along at least one side of a peripheral edge of the one face. The frame is formed by laminating a plurality of layers of a prepreg containing reinforced fiber impregnated with resin. The frame has a frame body to be fixed to the one face, and a shaft supporting portion formed integrally with the frame body and formed with an insertion hole for press-fitting a shaft-like member.

5 Claims, 9 Drawing Sheets

(56) References Cited

U.S. PATENT DOCUMENTS

| | | | |
|---|---|---|---|
| 7,679,894 B2* | 3/2010 | Yue | G06F 1/1601 |
| | | | 361/679.26 |
| 2003/0011973 A1* | 1/2003 | Jeong | G11B 25/043 |
| 2003/0142472 A1* | 7/2003 | Park | G06F 1/1656 |
| | | | 361/679.55 |
| 2013/0285516 A1* | 10/2013 | Mizoguchi | G06F 1/1637 |
| | | | 312/223.1 |

* cited by examiner

CHASSIS MEMBER, ELECTRONIC DEVICE, AND METHOD FOR MANUFACTURING THE CHASSIS MEMBER

FIELD OF THE INVENTION

The present invention relates to a chassis member used for a chassis of an electronic device, the electronic device, and a method for manufacturing the chassis member.

BACKGROUND OF THE INVENTION

A chassis of an electronic device such as a laptop PC needs to be lightweight, thin, and high-strength. A member used for such a chassis includes a chassis member obtained by forming a laminate of prepreg (fiber reinforced resin) containing reinforced fiber such as carbon fiber impregnated with matrix resin such as epoxy resin and injection-molding a resin frame around the laminate (refer to, for example, Japanese Patent Publication No. 6,491,720).

SUMMARY OF THE INVENTION

In Japanese Patent Publication No. 6,491,720, the chassis member using the prepreg is used for a display chassis of a laptop PC. Incidentally, the display chassis of the laptop PC is coupled to a body chassis through a hinge device. Then, in the chassis member in Japanese Patent Publication No. 6,491,720, the resin frame provided around the prepreg laminate ensures a width sufficient for the hinge device to be screwed. That is, in this configuration, a mounting plate and a mounting screw for the hinge device significantly intrude into the display chassis. Thus, in this configuration, it is difficult to bring a display close to an edge of the chassis, and a width of a bezel member surrounding a periphery of the display increases, which constitutes a hindrance to improvement in quality of appearance and miniaturization of the chassis.

The present invention has been made in view of the above-described problem on the prior art and has an object to provide a chassis member, an electronic device, and a method for manufacturing the chassis member, which enable the improvement in quality of appearance and miniaturization of the chassis.

A chassis member according to the first aspect of the present invention is a chassis member used for an electronic device including a face plate, and a frame to be fixed to one face of the face plate and provided along at least one side of a peripheral edge of the one face, in which the frame is formed by laminating a plurality of layers of a prepreg containing reinforced fiber impregnated with resin, the frame has a frame body to be fixed to the one face, and a shaft supporting portion formed integrally with the frame body and formed with an insertion hole for press-fitting a shaft-like member.

The shaft supporting portion may have a projecting portion standing from the one side in a surface normal direction of the one face, and the insertion hole may be formed in the projecting portion along the frame body and opened on an end face of the projecting portion while facing to a direction crossing the surface normal direction.

The projecting portion may be provided with a boss section surrounding at least a part of a periphery of the insertion hole, and the chassis member may further include a reinforcing ring surrounding an outer peripheral surface of the boss section.

The chassis member may further include a reinforcing sheet surrounding the frame body and the projecting portion all at once.

The reinforced fiber may extend along at least a longitudinal direction of the one side.

The frame body may extend along the peripheral edge of the one face in a frame shape to surround the one face, and the shaft supporting portion may be provided on one side of the frame body.

An electronic device according to the second aspect of the present invention is an electronic device including a chassis formed using a chassis member, in which the chassis member includes a face plate, and a frame to be fixed to one face of the face plate and provided along at least one side of a peripheral edge of the one face, the frame is formed by laminating a plurality of layers of a prepreg containing reinforced fiber impregnated with resin, the frame has a frame body to be fixed to the one face, and a shaft supporting portion formed integrally with the frame body and formed with an insertion hole for press-fitting a hinge shaft, the electronic device further includes a hinge relatively fixed to the chassis by the hinge shaft being press-fitted into the insertion hole, and a second chassis relatively rotatably coupled to the chassis by being rotatably coupled to the hinge shaft about its axis.

The electronic device may further include a display provided on a front face of the chassis and a keyboard provided on the second chassis, and the chassis may have a back face formed by the face plate and a side face formed by the frame.

A method for manufacturing a chassis member according to the third aspect of the present invention is a method for manufacturing a chassis member used for an electronic device, including a step of forming a raw frame by winding a prepreg containing reinforced fiber impregnated with resin around an outer surface of a mold to laminate a plurality of layers, a step of forming a frame body and a shaft supporting portion provided on one side of the frame body by processing the raw frame, and a step of forming an insertion hole for press-fitting a shaft-like member by processing the shaft supporting portion.

In the step of forming the shaft supporting portion, a projecting portion projecting from the one side and a boss section for surrounding at least a part of the insertion hole near an end face of the projecting portion may be formed, and the insertion hole may be formed by drilling in a direction press-fitting the shaft-like member from the end face.

The method for manufacturing a chassis member may further include a step of winding a sheet-like prepreg around an outer peripheral surface of the boss section in a circumferential direction for curing or a step of covering a metallic ring on the outer peripheral surface of the boss section.

The method for manufacturing a chassis member may further include a step of winding a sheet-like prepreg around the frame body and the shaft supporting portion for curing.

The method for manufacturing a chassis member may further include a step of fixing a frame provided with the frame body and the shaft supporting portion to one face of a plate-like member.

The aspects of the present invention enable the improvement in quality of appearance and miniaturization of the chassis.

DETAILED DESCRIPTION OF THE INVENTION

Hereinafter, a preferred embodiment of a chassis member according to the present invention in relation to an electronic device using this member is described in detail with reference to the attached drawings.

Figure 1:
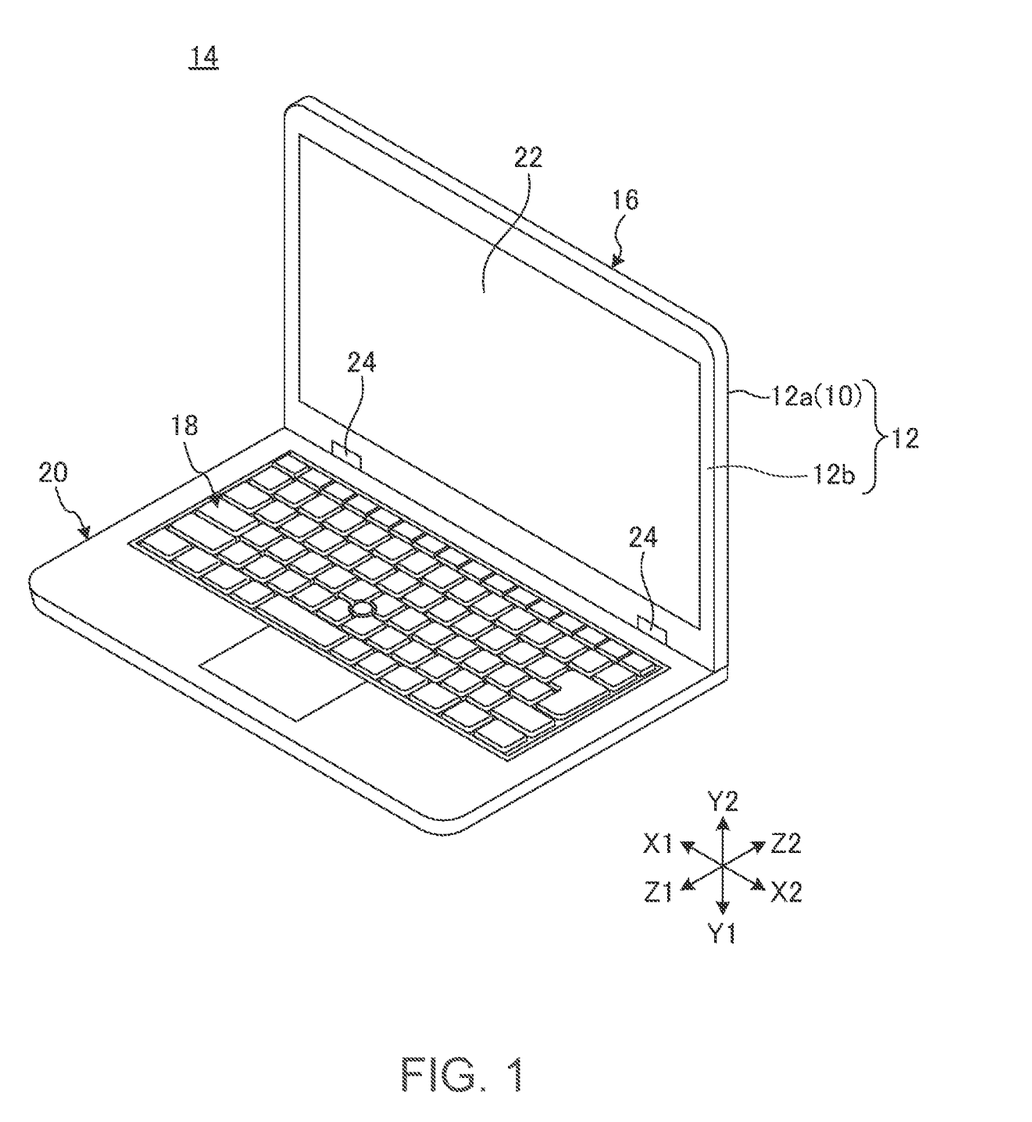
FIG. 1 is a perspective view of an electronic device including a chassis formed using a chassis member according to one embodiment.

FIG. 1 is a perspective view of an electronic device 14 including a chassis 12 formed using a chassis member 10 according to one embodiment. In the present embodiment, illustrated as an example is a configuration in which the chassis 12 using the chassis member 10 is used for a lid body 16 of the electronic device 14 that is a laptop PC. The chassis member 10 can be used for chassis of various electronic devices such as a tablet PC, a desktop PC, a smartphone, a cellular phone, and a portable game console.

As illustrated in FIG. 1, the electronic device 14 includes a device body 20 having a keyboard 18, and the rectangular flat plate-like lid body 16 having a display 22 composed of a liquid crystal display etc. The lid body 16 and the device body 20 are relatively rotatably coupled through right and left hinges 24. Inside of the device body 20, various electronic components such as a board, an arithmetic processing device, a hard disk drive, and a memory (not illustrated), are stored. The keyboard 18 may be a software-implemented keyboard that is displayed on a display (not illustrated) provided on a top surface of the device body 20 and is touch-manipulated.

The lid body 16 is configured by providing the display 22 on a front face of the chassis 12. The chassis 12 is composed of a back cover 12a and a front cover 12b. The back cover 12a is a cover member that covers a back face and four peripheral side faces of the lid body 16, and is formed by the chassis member 10 according to the present embodiment. The front cover 12b is a bezel member that covers four peripheral edge portions of the front face of the lid body 16 and is made of resin or metal etc., the display 22 being disposed in an opening formed in the center of the lid body 16.

Figure 2:
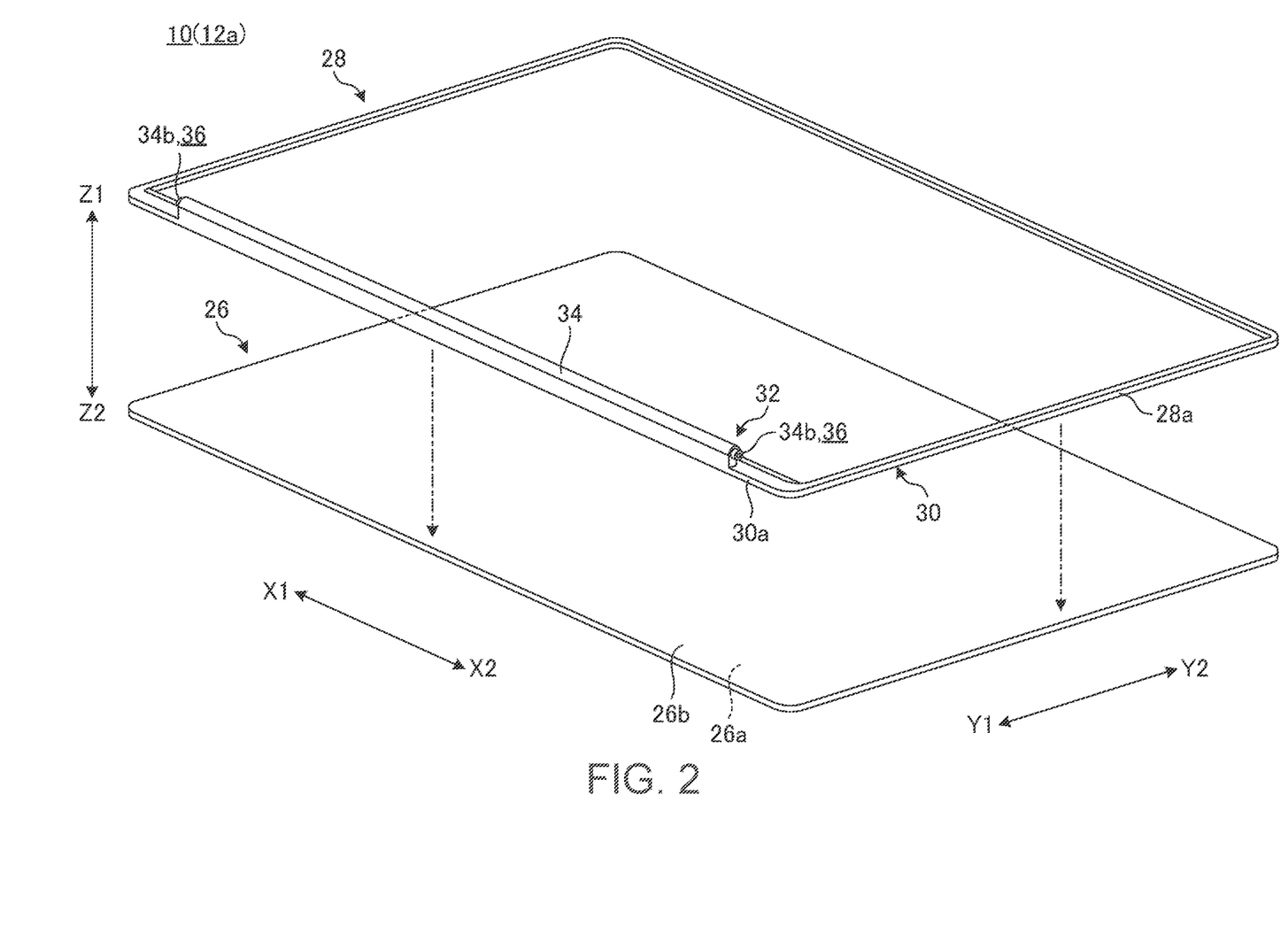
FIG. 2 is an exploded perspective view schematically illustrating a configuration of the chassis member.
Figure 3:
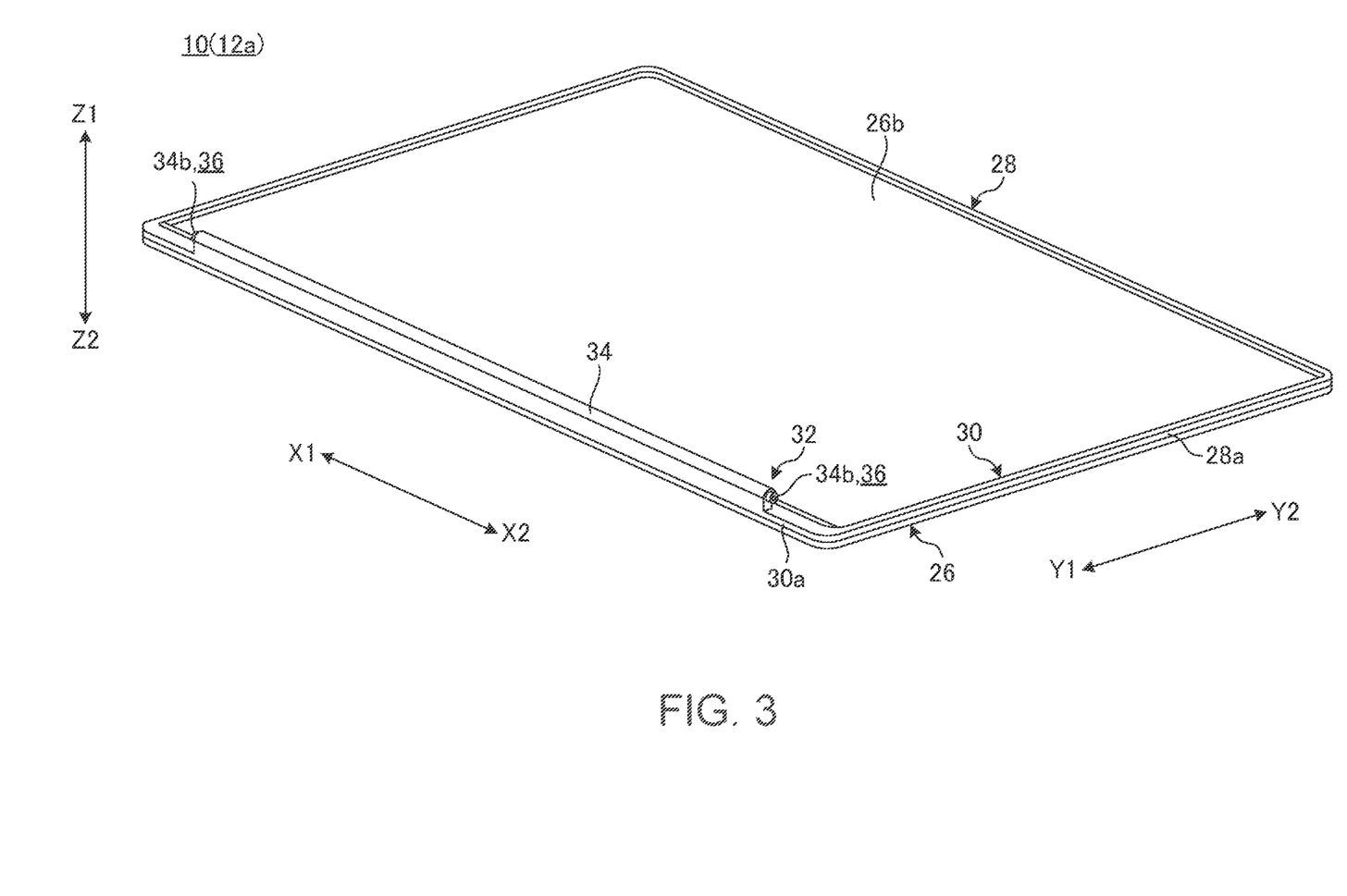
FIG. 3 is a perspective view schematically illustrating the configuration of the chassis member.

Next, specifically described is a configuration of the chassis member 10 forming the back cover 12a of the lid body 16. FIG. 2 is an exploded perspective view schematically illustrating the configuration of the chassis member 10, and illustrates an inner face side of the back cover 12a in which the display 22 etc. is stored. FIG. 3 is a perspective view schematically illustrating the configuration of the chassis member 10.

Hereinafter, the chassis member 10 (back cover 12a) is described based on a posture as illustrated in FIG. 2 and FIG. 3, while referring to the front side as Y1, the back side as Y2, the left side as X1, the right side as X2, further the top side in a plate thickness direction as Z1, and the bottom side as Z2. For these respective directions, the Y1 direction and Y2 direction may be collectively referred to as a Y direction, the X1 direction and X2 direction may be collectively referred to as an X direction, and the Z1 direction and Z2 direction may be collectively referred to as a Z direction. It is to be noted that each direction, in a state in which the chassis member 10 (back cover 12a) is used for the electronic device 14, is as illustrated in FIG. 1.

As illustrated in FIG. 2 and FIG. 3, the chassis member 10 includes a face plate 26 and a frame 28.

The face plate 26 is a thin rectangular plate. The face plate 26 forms a back face of the chassis 12. That is, an outer face 26a of the face plate 26 serves as the back face of the chassis 12, and an inner face 26b of the face plate 26 serves as a supporting face for the display 22 facing inside of the chassis 12. The face plate 26 is composed of, for example, a prepreg laminate, a glass plate, a resin plate, or a metallic plate, such as aluminum or titanium. The prepreg laminate is formed by laminating a plurality of layers of the prepreg containing, for example, reinforced fiber such as carbon resin impregnated with thermosetting resin or thermoplastic resin such as epoxy resin.

The frame 28 is fixed to the inner face 26b of the face plate 26 with an adhesive etc. The frame 28 is a frame body that extends along four peripheral edge portions of the inner face 26b to surround the inner face 26b. The frame 28 forms a side face of the chassis 12. That is, an outer peripheral face 28a of the frame 28 serves as four peripheral side faces of the chassis 12. The frame 28 further has a function as a reinforcing member enhancing the rigidity of the face plate 26 and a function as a mounting part for the hinge 24.

Figure 4:
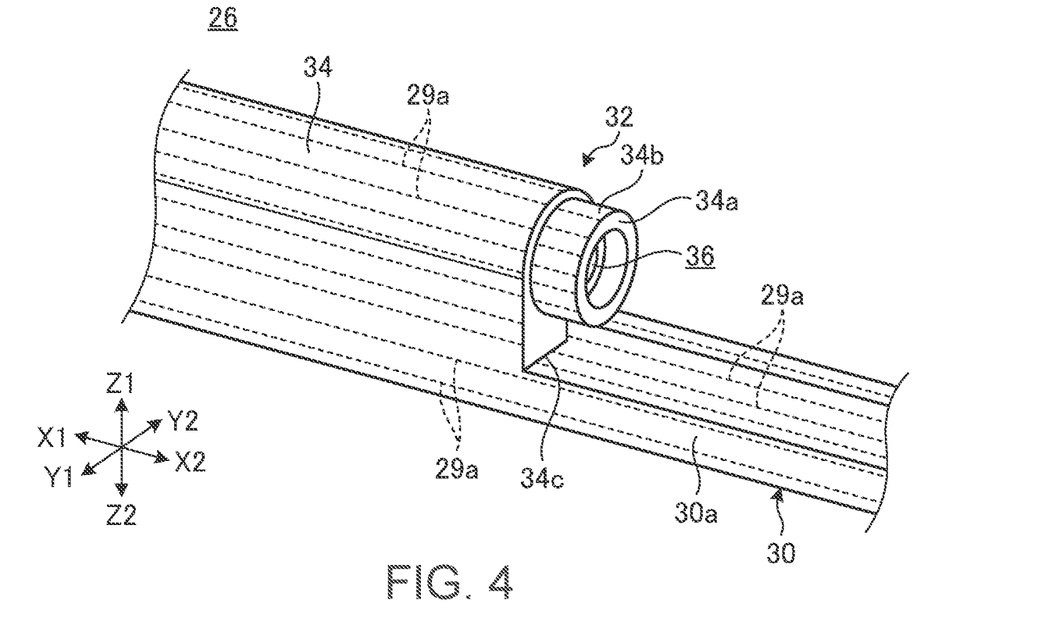
FIG. 4 is a perspective view enlarging an insertion hole and its peripheral part.
Figure 5:
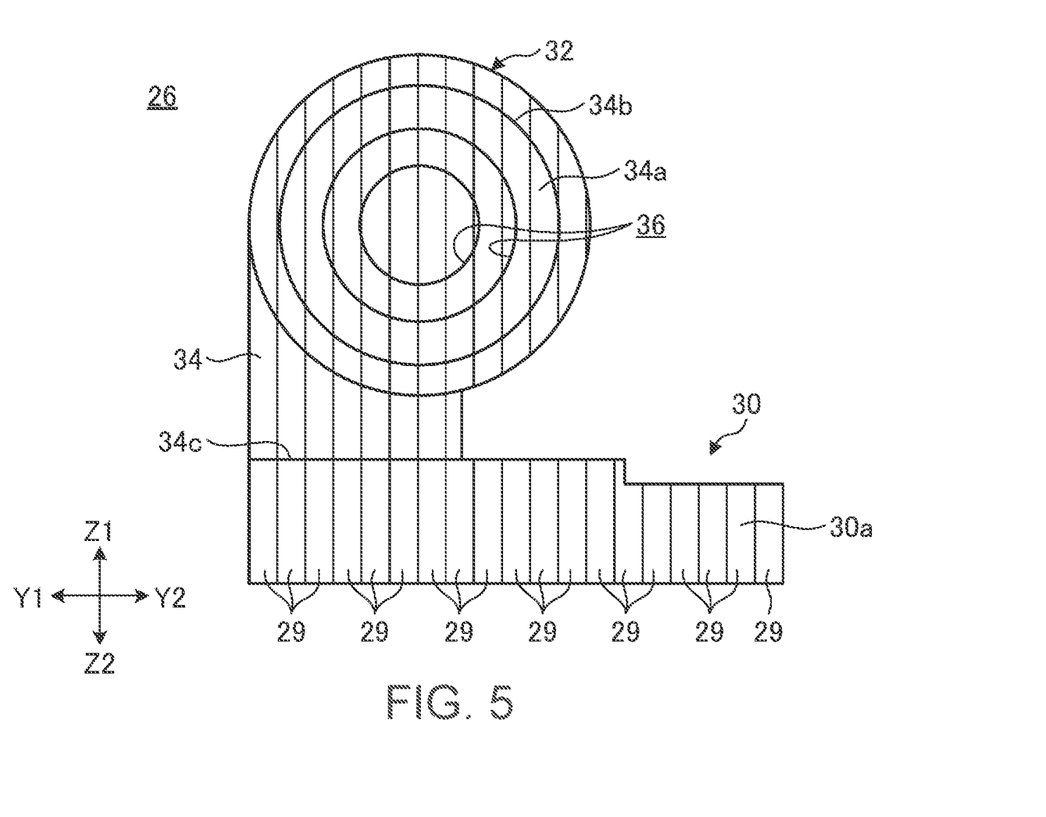
FIG. 5 is a cross-sectional view of cutting a frame at a position crossing a projecting portion.

The frame 28 is obtained by machining a plate formed by laminating a plurality of layers of the prepreg 29 containing, for example, reinforced fiber such as carbon resin impregnated with thermosetting resin or thermoplastic resin such as epoxy resin (refer to FIG. 5). Thus, the frame is lightweight and high-strength. In the present embodiment, the frame 28 is formed using carbon fiber-reinforced polymer (CFRP) using carbon fiber as reinforced fiber. As the reinforced fiber, various materials, for example, metallic fiber such as stainless fiber or inorganic fiber such as glass fiber, may be used. The reinforced fiber extends along the extending direction (longitudinal direction) of the frame 28, i.e., a direction in which the frame 28 surrounds the inner face 26b of the face plate 26 in a frame shape (refer to reinforced fibers 29a illustrated by dashed lines in FIG. 4). If the face plate 26 is also prepreg, the frame 28 may be fixed to the face plate 26 by thermal welding.

The frame 28 has a frame body 30 and a shaft supporting portion 32. The frame body 30 and the shaft supporting portion 32 are integrally formed. The frame body 30 and the shaft supporting portion 32 of the frame 28 are formed by machining the laminated body of the prepreg 29, which is mentioned later in detail.

The frame body 30 is a rectangular frame-like portion that is fixed to the inner face 26b of the face plate 26 and disposed to extend along the peripheral edge of the inner face 26b. FIG. 2 and FIG. 3 illustrate as an example a configuration in which the frame body 30 has four sides: one side 30a along the X direction on the Y1 side is formed a little wider and three remaining sides are formed narrower than the side 30a, however, the width and shape of each side can be changed as necessary.

Figure 6A:
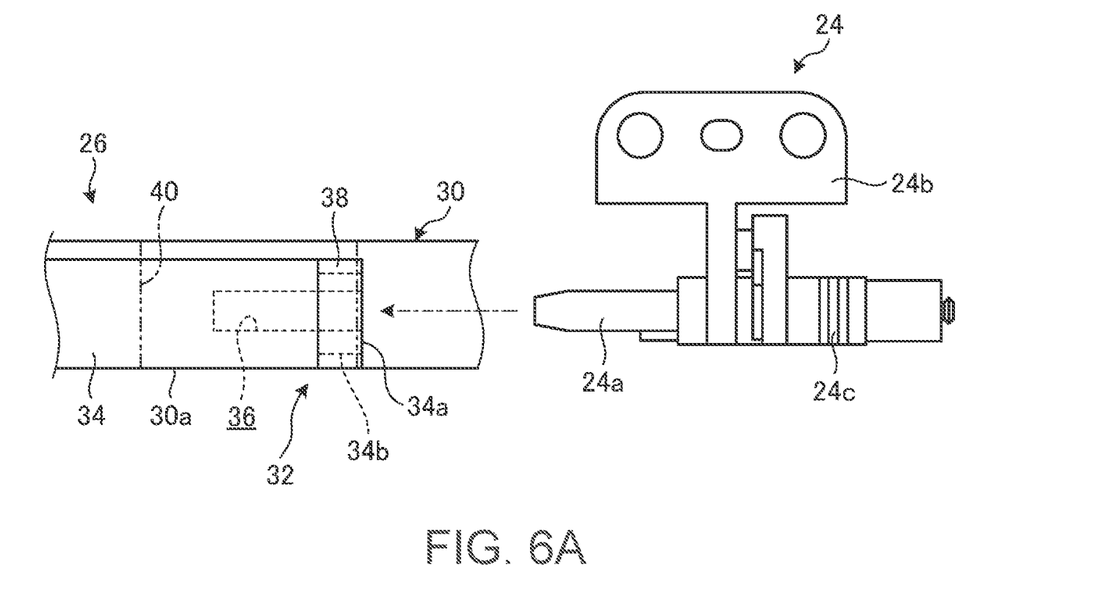
FIG. 6A is a plan view schematically illustrating an operation of press-fitting a hinge shaft into the insertion hole.
Figure 6B:
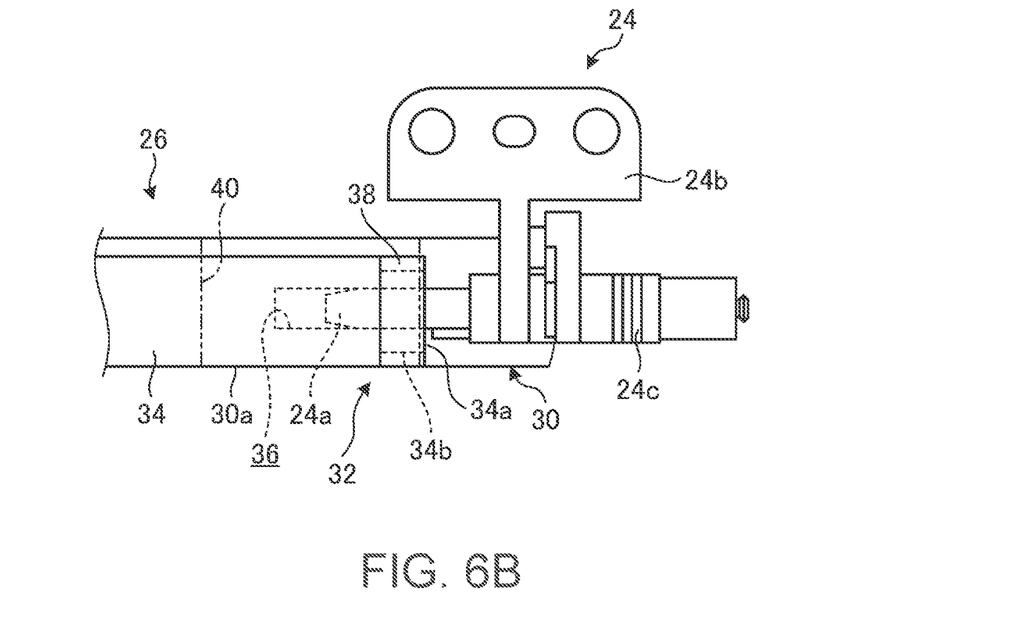
FIG. 6B is a plan view in a state in which the hinge shaft is press-fitted into the insertion hole from the state as illustrated in FIG. 6A.

The shaft supporting portion 32 is a portion that supports a hinge shaft 24a of the hinge 24 (refer to FIG. 6A and FIG. 6B). The shaft supporting portion 32 is formed on the side 30a of the frame body 30 on the Y1 side. The shaft supporting portion 32 has a projecting portion 34 that is provided on the side 30a and insertion holes 36 that are respectively formed on right and left end faces of the projecting portion 34 in the X direction.

FIG. 4 is a perspective view enlarging the insertion hole 36 and its peripheral part. FIG. 4 representatively illustrates a configuration of the insertion hole 36 facing toward the X2 in FIG. 2 and FIG. 3 and its peripheral part. A configuration of the insertion hole 36 facing toward the X1 and its peripheral part has a symmetrical structure to that facing toward the X2, and thus a detailed description thereof is omitted.

As illustrated in FIG. 2 to FIG. 4, the projecting portion 34 is a wall body that has a substantial hog-backed shape in cross section, stands from the side 30a in a surface normal direction (Z1 direction), and extends in the X direction. The length of the projecting portion 34 in the X direction is shorter than that of the side 30a of the frame body 30 in the X direction. Thus, the insertion holes 36 formed on the end faces of the projecting portion 34 are located at positions retracted in the X direction from each of right and left sides of the frame body 30 extending in the Y direction, and the hinges 24 are disposed in the retracted spaces (refer to FIG. 6B). A shape of the projecting portion 34 can be changed as necessary.

The insertion holes 36 are opened on the right and left end faces 34a of the projecting portion 34. Each of right and left end portions of the projecting portion 34 is provided with a cylindrical boss section 34b that surrounds at least a part of the insertion hole 36. The boss section 34b is a cylinder that has an outer diameter one size smaller than an arc-shaped top face of the projecting portion 34. The boss section 34b may be omitted, and in that case, the cross section of the projecting portion 34 may be formed in the same shape over its entire length. However, when a reinforcing ring 38 mentioned below is installed, it is preferable to provide the boss section 34b (refer to FIG. 7).

The insertion hole 36 is a hole for press-fitting the hinge shaft 24a. The insertion hole 36 is formed on an axis of the boss section 34b along an axial direction. The insertion holes 36 are formed in the projecting portion 34 along the frame body 30 and are opened on the right and left end faces 34a of the projecting portion 34 while facing to a direction crossing the surface normal direction (Z direction) of the inner face 26b of the face plate 26. In the present embodiment, the insertion holes 36 are opened facing to, for example, a direction perpendicular to the surface normal direction of the inner face 26b, specifically, the X direction that is the longitudinal direction of the projecting portion 34 and the side 30a. Then, the insertion hole 36 in the present embodiment is formed by drilling the projecting portion 34 in the direction (X direction) press-fitting the hinge shaft 24a from the end face 34a. FIG. 4 and FIG. 5 illustrate as an example the insertion hole 36 of stepped structure in which an inner diameter reduces from the opening side toward the deep side in two steps. The insertion hole 36 may be formed to have the same inner diameter from the opening side toward the deep side.

FIG. 5 is a cross-sectional view of cutting the frame 28 at a position crossing the projecting portion 34, and is a view of cutting the side 30a and the projecting portion 34 on a plane (Y-Z plane) orthogonal to the X direction. In FIG. 5, a hatching indicating a cross section is omitted.

As illustrated in FIG. 5, in the frame 28, the plurality of layers of the prepregs 29 is laminated in the width direction and fixed to each other. In the part as illustrated in FIG. 5 including the side 30a and the projecting portion 34, the prepregs 29 are laminated in the Y direction. In a side on the Y2 side, opposed to the side 30a, the prepregs 29 are laminated in the Y direction. In other two sides that are orthogonal to the side 30a and extend in the Y direction, the prepregs 29 are laminated in the X direction. The insertion hole 36 is formed by drilling the laminate of the laminated and fixed prepregs 29 by machining. The frame 28 may be formed by laminating the prepregs 29 in its thickness direction (Z direction).

Next, a specific structure of mounting the hinge 24 with respect to the insertion hole 36 is described. FIG. 6A is a plan view schematically illustrating an operation of press-fitting the hinge shaft 24a into the insertion hole 36. FIG. 6B is a plan view in a state in which the hinge shaft 24a is press-fitted into the insertion hole 36 from the state as illustrated in FIG. 6A.

As illustrated in FIG. 6A and FIG. 6B, the hinge 24 in the present embodiment has the hinge shaft 24a, a bracket 24b, and a torque generating part 24c.

The hinge shaft 24a is a metallic shaft-like member that serves as a rotation axis of the hinge 24. The bracket 24b is a metallic component that is relatively rotatably and externally inserted to the hinge shaft 24a. The bracket 24b has a plurality of through holes and is screwed to the device body 20. The torque generating part 24c gives a predetermined rotation torque to a relative rotation between the hinge shaft 24a and the bracket 24b.

The hinge shaft 24a is unrotatably fixed to the chassis 12 (lid body 16) by being press-fitted into the insertion hole 36. That is, the device body 20 fixed to the bracket 24b is in a state of relatively rotatable about the axis of the hinge shaft 24a fixed to the lid body 16. As a result, the hinge 24 relatively rotatably couples the lid body 16 and the device body 20.

In such a frame 28, the frame body 30 may be formed in a rod shape of only one side 30a provided with the shaft supporting portion 32 or may be formed of two sides or three sides including the side 30a. If the frame 28 is formed of two sides or three sides, each side may not be connected to each other.

By the way, the insertion hole 36 is formed by drilling the laminate of the prepregs 29, as illustrated in FIG. 5. Thus, boundaries between the prepregs 29 are also formed at positions overlapping the insertion hole 36. Therefore, for example, if a great external force is given between the lid body 16 and the device body 20 and an inner peripheral surface of the insertion hole 36 receives a load from the hinge shaft 24*a*, there are concerns that the layers of the laminated prepregs 29 may be delaminated along a fiber direction of the reinforced fibers 29*a*. For example, in the configuration example as illustrated in FIG. 5, when a load is applied from the hinge shaft 24*a* to the insertion hole 36, there are concerns that the boundaries between the prepregs 29 at the positions overlapping the insertion hole 36 may be delaminated in the Y direction. In addition, such a delamination of the prepregs 29 can also occur in press-fitting the hinge shaft 24*a* into the insertion hole 36. Further, there are also concerns that when the frame 28 receives a load from the hinge shaft 24*a* in the Z1 direction in FIG. 5, a crack or a breakage may occur at a boundary portion 34*c* (refer to FIG. 4) between the projecting portion 34 and the frame body 30.

Figure 7:
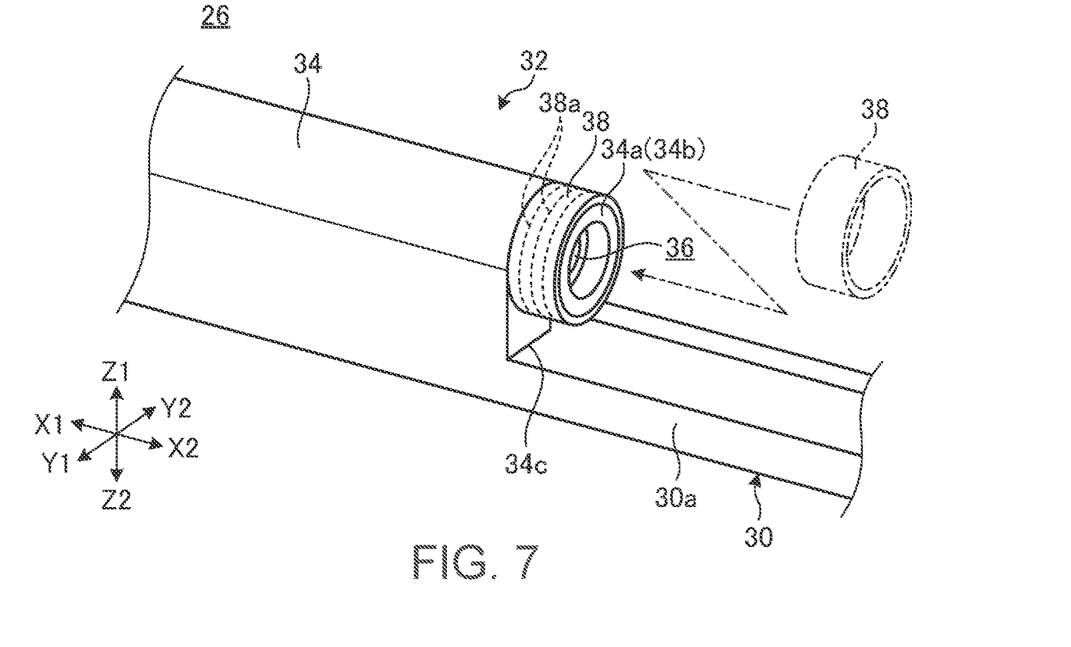
FIG. 7 is a perspective view enlarging the insertion hole and its peripheral part in a state in which a reinforcing ring is attached to a boss section.

Then, it is preferable that the frame 28 in the present embodiment includes the reinforcing ring 38 and a reinforcing sheet 40 and is configured to be able to suppress the above-described problem. FIG. 7 is a perspective view enlarging the insertion hole 36 and its peripheral part in a state in which the reinforcing ring 38 is attached to the boss section 34*b*.

As illustrated in FIG. 7, the reinforcing ring 38 is a ring-like member that is fixed to surround an outer peripheral surface of the boss section 34*b*. The reinforcing ring 38 is, for example, a strip-shaped prepreg that is wound in a circumferential direction of the boss section 34*b* once or plural times to be fixed. Reinforced fiber 38*a* included in the reinforcing ring 38 is, for example, carbon fiber. The reinforced fiber 38*a* extends along a circumferential direction of the outer peripheral surface of the boss section 34*b*. Thus, the reinforcing ring 38 prevents the delamination of the prepregs 29 due to the load from the hinge shaft 24*a* to the inner peripheral surface of the insertion hole 36. The reinforcing ring 38 may be a ring-like member made of metal or resin.

As described above, the boss section 34*b* in the present embodiment has an outer diameter that is one size smaller than that of the projecting portion 34. Then, the reinforcing ring 38 is stored in a step formed between the boss section 34*b* and the projecting portion 34. This can prevent the reinforcing ring 38 from forming a protruding step between the projecting portion 34 and the boss section 34*b*.

Figure 8:
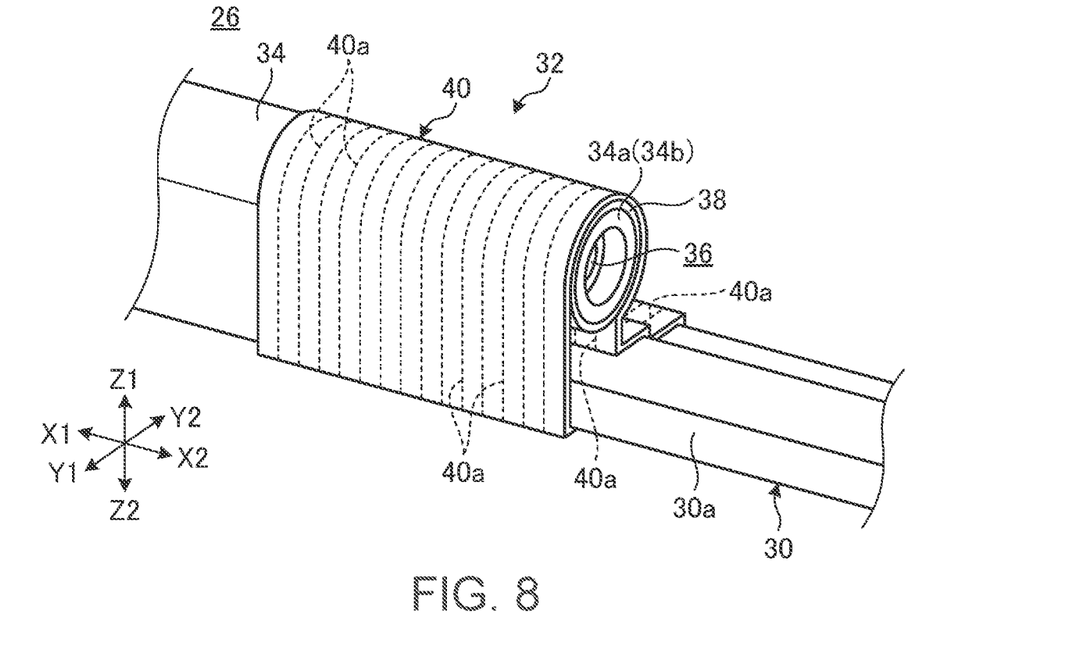
FIG. 8 is a perspective view in a state in which a reinforcing sheet is attached to a shaft supporting portion as illustrated in FIG. 7.
Figure 9:
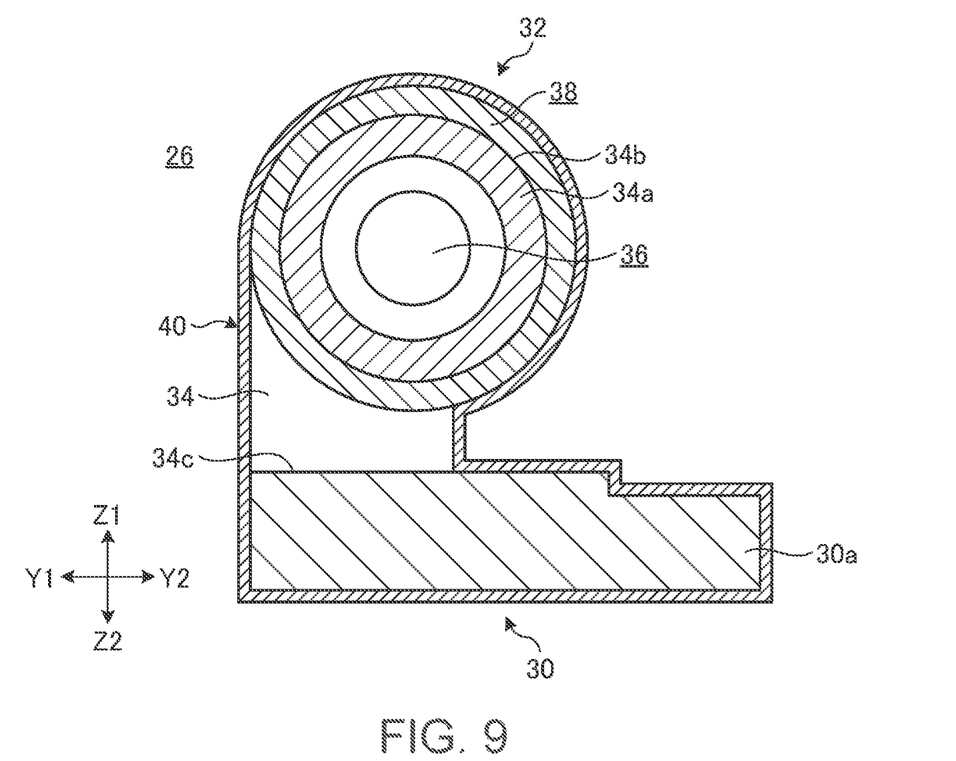
FIG. 9 is a schematic cross-sectional view of cutting a frame as illustrated in FIG. 8 at a position crossing the reinforcing ring.

FIG. 8 is a perspective view in a state in which the reinforcing sheet 40 is attached to the shaft supporting portion 32 as illustrated in FIG. 7. FIG. 9 is a schematic cross-sectional view of cutting the frame 28 as illustrated in FIG. 8 at a position crossing the reinforcing ring 38.

As illustrated in FIG. 8 and FIG. 9, the reinforcing sheet 40 is a strip-shaped sheet that is fixed to surround the side 30*a* of the frame body 30, the projecting portion 34, and the reinforcing ring 38 (boss section 34*b*) all at once. The reinforcing sheet 40 is, for example, a strip-shaped prepreg that is wound in a circumferential direction of the frame body 30 and the projecting portion 34 once or plural times to be fixed. Reinforced fiber 40*a* included in the reinforcing sheet 40 is, for example, carbon fiber. The reinforced fiber 40*a* extends along a circumferential direction of the outer peripheral surface of the frame body 30 and the projecting portion 34. Although the reinforcing sheet 40 may be provided over the entire length of the projecting portion 34, they are provided at least near the right and left boss sections 34*b*, i.e., near the boundary portions 34*c*. Thus, the reinforcing sheet 40 suppresses a crack or a breakage in the boundary portion 34*c* due to the load from the hinge shaft 24*a* to the inner peripheral surface of the insertion hole 36. The reinforcing sheet 40 may be a sheet-like member made of metal or resin. The reinforcing sheet 40 may be provided at a position not covering the boss section 34*b*.

Figure 10:
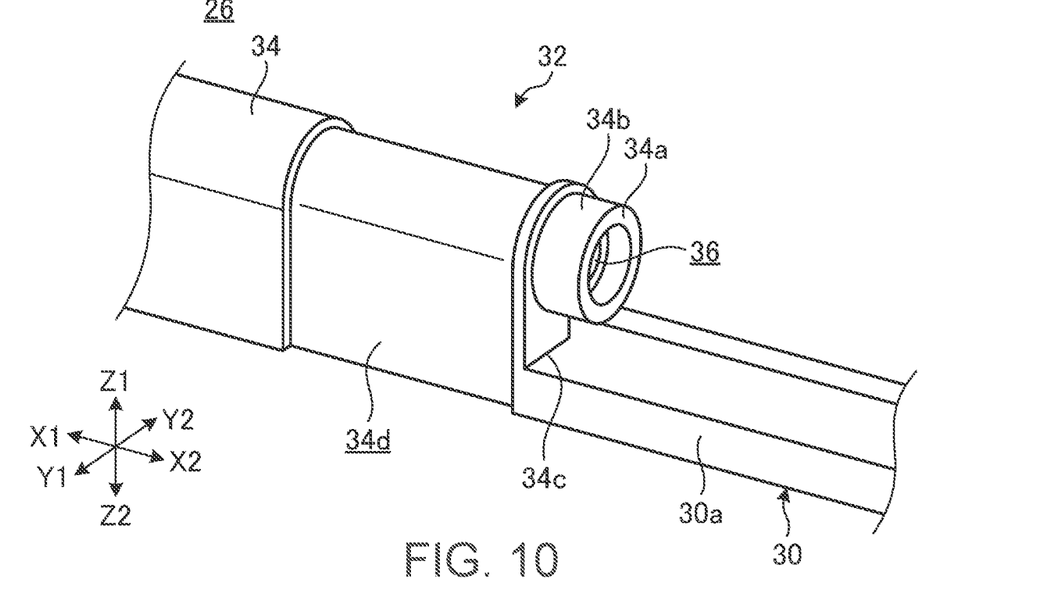
FIG. 10 is a perspective view enlarging the insertion hole and its peripheral part in a configuration example in which a recessed portion for storing the reinforcing sheet is provided.

As illustrated in FIG. 10, the projecting portion 34 and the frame body 30 may be provided with a recessed part 34*d* in which the outer peripheral surface is recessed to provide the reinforcing sheet 40. Thus, the reinforcing sheet 40 is stored in the recessed part 34*d*, and it can be prevented that a protruding step is formed on an outer surface of the projecting portion 34 etc.

Only either one of the reinforcing ring 38 and the reinforcing sheet 40 may be used. In addition, for example, when the load from the shaft-like member to the insertion hole 36 is not assumed or is considerably small, the reinforcing ring 38 and the reinforcing sheet 40 may be omitted.

Next, one procedure of a manufacturing method of the chassis member 10 is described. FIG. 11A to FIG. 11D are explanatory views schematically illustrating a manufacturing process of the chassis member 10.

Figure 11A:
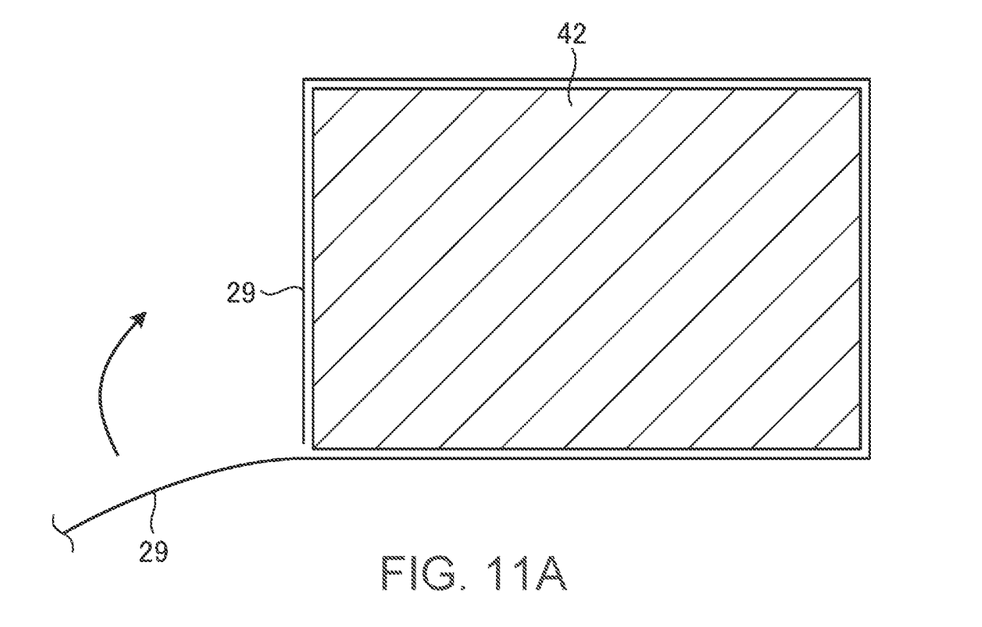
FIG. 11A is an explanatory view of a process of winding a prepreg around a mold.

As described above, the frame body 30 and the shaft supporting portion 32 of the frame 28 are formed by machining the laminated body of the prepregs 29. First, in manufacturing the frame 28, a rectangular rod-like mold 42 matched to an inner peripheral shape of the frame 28 is prepared, as illustrated in FIG. 11A. Then, a long sheet-like prepreg 29 is wound around an outer peripheral surface of the mold 42 plural times. The width of the prepreg 29 to be wound must be at least not lower than a Z-directional height of the frame 28, and is that of seven or more frames 28 in the present embodiment (refer to FIG. 11C). It is to be noted that, although the first turn of the prepreg 29 is illustrated to be separated from the outer surface of the mold 42 in FIG. 11A, the first turn of the prepreg 29 is actually in contact with the outer surface of the mold 42.

Figure 11B:
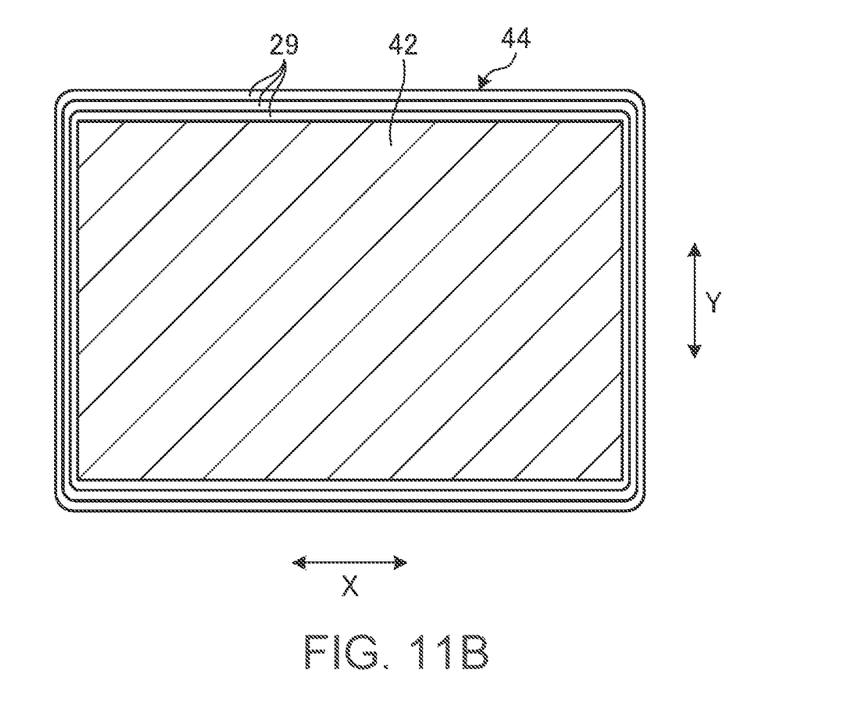
FIG. 11B is a view illustrating a state in which the prepreg is wound around the mold to form a laminated body.

The prepreg 29 is wound around the outer surface of the mold 42 until it reaches a predetermined laminate thickness, specifically until it reaches at least a thickness not less than a width dimension of each side of the frame 28. When the winding of the prepreg 29 is completed, the prepreg 29 is laminated in a roll shape on the outer surface of the mold 42 and a rectangular cylindrical laminated body 44 having a predetermined thickness is formed, as illustrated in FIG. 11B. After the completion of the winding of the prepreg 29, each layer of the prepreg 29 of the laminated body 44 is collectively heated to be cured, and thus each layer of the prepreg 29 may be fixed by welding to each other. The prepregs 29 may be fixed to each other by an adhesive.

Figure 11C:
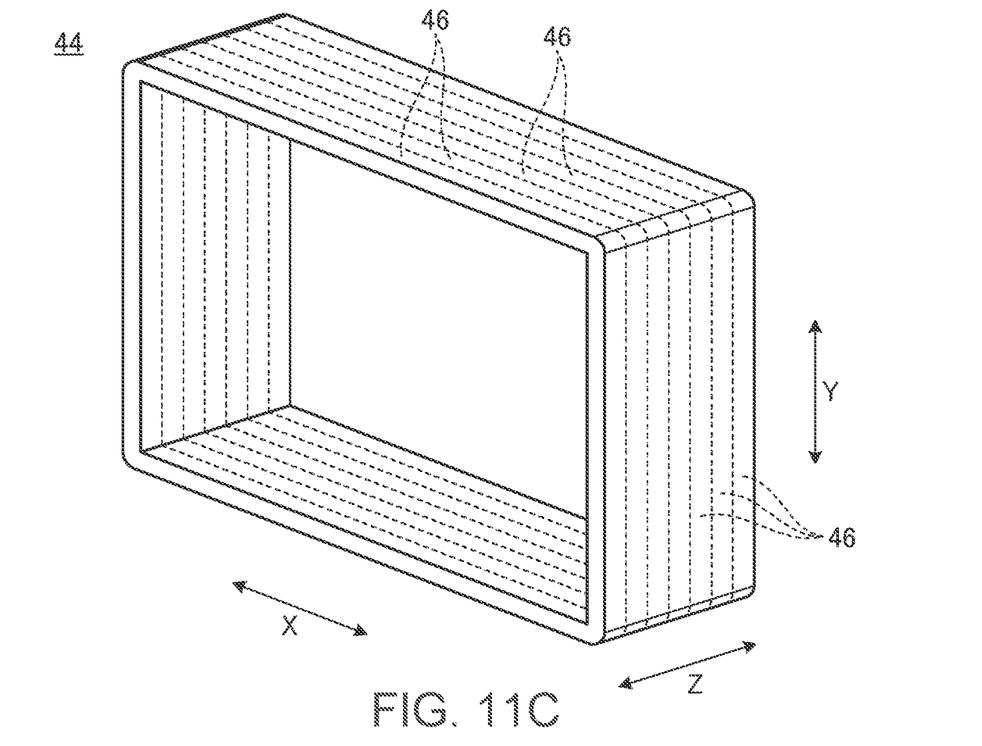
FIG. 11C is a perspective view in a state in which the laminated body is withdrawn from the mold.

Then, the laminated body 44 is withdrawn from the mold 42. As illustrated in FIG. 11C, the laminated body 44 has a size equal to a plurality of raw frames 46 laminated in the Z direction, the raw frame 46 being an original form of the frame 28 before fine processing. FIG. 11C illustrates as an example the laminated body 44 having a height equivalent to seven raw frames 46. Then, the laminated body 44 is in turn cut into rings along boundary lines between the raw frames 46 illustrated by dashed lines in FIG. 11C and divided into each raw frame 46.

Figure 11D:
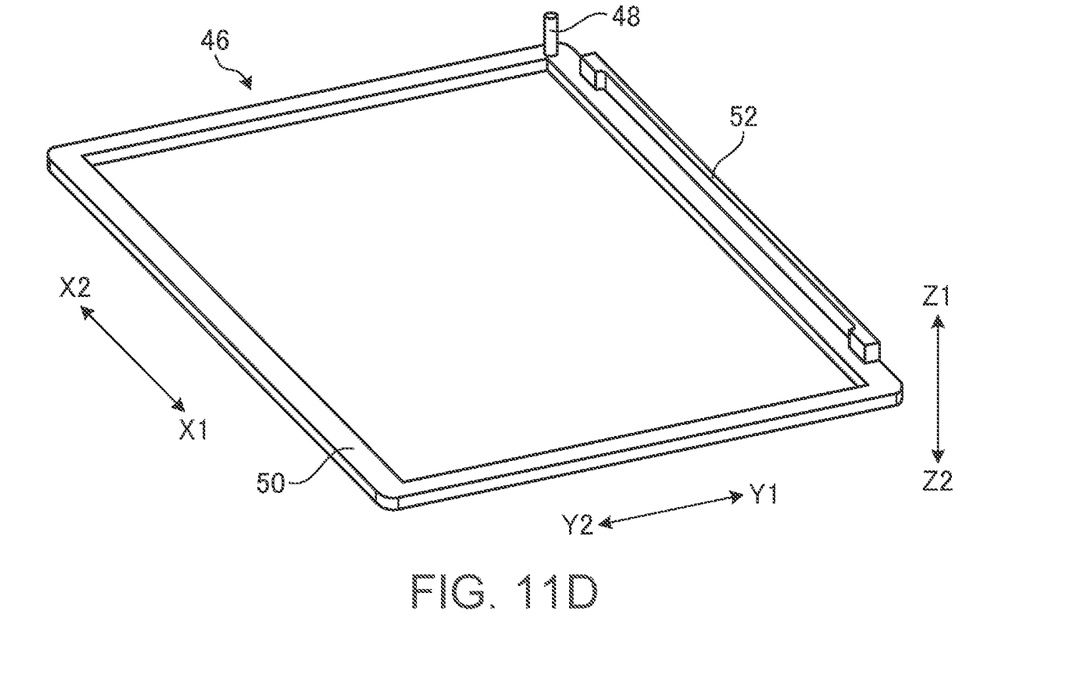
FIG. 11D is an explanatory view illustrating a state in which a raw frame cut out from the laminated body is being machined.

Next, the raw frame 46 is machined using a CNC machine tool, as illustrated in FIG. 11D. A reference symbol 48 in FIG. 11D is, for example, an end mill 48 of the CNC machine tool. FIG. 11D illustrates a state in the middle of processing the raw frame 46 into the frame 28. A reference symbol 50 in FIG. 11D is an original form of the frame body 30, and a reference symbol 52 is an original form of the shaft supporting portion 32. Then, after the insertion hole 36 is also drilled and the processing of the raw frame 46 is completed, the molding of the frame 28 is completed.

Next, a process of attaching the reinforcing ring 38 is carried out. When the reinforcing ring 38 is a prepreg, a strip-shaped prepreg sheet is wound around the outer peripheral surface of the boss section 34b. Then, the reinforcing ring 38 is fixed to the boss section 34b by heating and curing the resin of the prepreg. On the other hand, when the reinforcing ring 38 is a ring-like member made of resin or metal, it may be externally fitted from a tip of the boss section 34b and fixed by an adhesive etc.

Next, a process of attaching the reinforcing sheet 40 is carried out. When the reinforcing sheet 40 is a prepreg, a strip-shaped prepreg sheet is wound to cover outer peripheral surfaces of the frame body 30, the projecting portion 34, and the reinforcing ring 38 all at once. Then, the reinforcing sheet 40 is fixed to the frame 28 by heating and curing the resin of the prepreg. On the other hand, when the reinforcing sheet 40 is a sheet made of resin or metal, it may be wound around the frame body 30 and the projecting portion 34 and fixed by an adhesive etc.

Finally, the thus formed frame 28 is fixed to the face plate 26 and manufacturing of the chassis member 10 is completed. It is to be noted that the frame 28 and the face plate 26 of the chassis member 10 may be manufactured at different manufacturing facilities and integrated in a final assembly process. Then, a manufacturing method of the chassis member may include only a process for manufacturing the frame 28, omitting a final process for fixing the frame 28 and the face plate 26.

As stated above, the chassis member 10 according to the present embodiment includes the face plate 26, and the frame 28 that is fixed to the inner face 26b of the face plate 26 and provided along at least one side of a peripheral edge of the inner face 26b. The frame 28 is formed by laminating a plurality of layers of the prepreg 29 containing the reinforced fiber 29a impregnated with matrix resin. Further, the frame 28 has the frame body 30 to be fixed to the inner face 26b of the face plate 26, and the shaft supporting portion 32 that is formed integrally with the frame body 30 and formed with the insertion hole 36 for press-fitting the shaft-like member (hinge shaft 24a).

As stated above, the chassis member 10 has the insertion hole 36 formed in the frame 28 that is fixed to the inner face 26b of the face plate 26. Then, the hinge shaft 24a as the shaft-like member can be press-fitted into the insertion hole 36. Thus, in the chassis member 10, no space is required for screwing a mounting plate for the hinge 24. Thus, the frame 28 can be formed as narrow as possible and electronic components such as the display 22 can be mounted as close to an edge of the chassis 12 as possible. As a result, the use of the chassis member 10 can make the bezel member (front cover 12b) surrounding the display 22 as narrow as possible, and thus the quality of appearance of the chassis 12 is improved and further miniaturization can be made. In addition, since the frame 28 is of laminated structure of the prepregs 29, it is lightweight and high-strength. Furthermore, since the frame 28 and the face plate 26 of the chassis member 10 are separate structures, a shape and/or other characteristics of the frame 28 or the face plate 26 can be easily changed depending on a specification of the electronic device 14 or the chassis 12 used, and wide versatility is obtained.

It is preferable that the frame 28 surrounds the inner face 26b of the face plate 26 in a frame shape, as illustrated in FIG. 2 and FIG. 3. Thus, an effect of reinforcing the chassis member 10 by the frame 28 is enhanced, and the outer peripheral face 28a of the frame 28 can also be used as a side face of the chassis 12.

In the frame 28, the projecting portion 34 constituting the shaft supporting portion 32 stands on the frame body 30. Thus, the frame 28 can easily secure a mounting space for the hinge 24. It is to be noted that since the hinge shaft 24a of the hinge 24 is directly fixed to the insertion hole 36 without using a screw, a plate thickness of the chassis member 10, even if the projecting portion 34 is provided, is the same as or can be made thinner than that in the case of a conventional hinge of screw fastening structure. In addition, the projecting portion 34 also functions as a hinge cover that fills a gap between the lid body 16 and the device body 20, the gap being formed by the hinge 24.

Meanwhile, it is a matter of course that the present invention is not limited to the embodiment described above and can be freely altered without deviating from the spirit of the present invention.

In the above, illustrated as an example is the configuration in which the chassis member 10 is used for the chassis 12 of the lid body 16 constituting the electronic device 14. However, the chassis member 10 may be used for the device body 20.

In the above, illustrated as an example is the configuration in which the frame 28 is provided only on the inner face 26b of the face plate 26. However, depending on applications of the chassis member 10, the frame 28 may be provided both on the inner face 26b and the outer face 26a of the face plate 26 or only on the outer face 26a.

In the above, illustrated as an example is the configuration in which the shaft supporting portion 32 is provided on the side 30a of the frame 28 corresponding to a long side of the chassis 12 and the hinge 24 is coupled to the shaft supporting portion 32. However, the shaft supporting portion 32 may be provided on a short side of the chassis 12.

The invention claimed is:

1. A chassis member used for an electronic device, comprising: a face plate in the form of a sheet; and a frame that is fixed to one face of the face plate and that is along at least one side of a peripheral edge of the one face, wherein the frame has a plurality of laminated layers of a prepreg containing reinforced fiber impregnated with resin, wherein the frame has: a frame body fixed to the one face; and a shaft supporting portion integral with the frame body and has an insertion hole for press-fitting a shaft-like member; and wherein the shaft supporting portion has a projecting portion extending from the one side in a surface normal direction of the one face, and the insertion hole is in the projecting portion along the frame body and is opened on an end face of the projecting portion and in a direction that crosses the surface normal direction; and wherein the projecting portion has a boss section surrounding at least a part of a periphery of the insertion hole, and the chassis member further comprises a reinforcing ring surrounding an outer peripheral surface of the boss section; and wherein the reinforced fiber extends along at least a longitudinal direction of the one side.

2. The chassis member according to claim 1, further comprising a reinforcing sheet surrounding the frame body and the projecting portion.

3. The chassis member according to claim 1, wherein
  the frame body extends along the peripheral edge of the one face in a frame shape to surround the one face, and the shaft supporting portion is on one side of the frame body.

4. An electronic device comprising a chassis having a chassis member, wherein the chassis member comprises: a face plate in the form of a sheet; and a frame that is fixed to one face of the face plate and that is along at least one side of a peripheral edge of the one face, wherein the frame has a plurality of laminated layers of a prepreg containing reinforced fiber impregnated with resin, wherein the frame has: a frame body fixed to the one face; and a shaft supporting portion integral with the frame body and has an insertion hole for press-fitting a hinge shaft, wherein the electronic device further comprises: a hinge relatively fixed to the chassis by the hinge shaft press-fitted into the insertion hole; and a second chassis relatively rotatably coupled to the chassis by the hinge shaft about its axis; and wherein the shaft supporting portion has a projecting portion extending from the one side in a surface normal direction of the one face, and the insertion hole is in the projecting portion along the frame body and is opened on an end face of the projecting portion and in a direction that crosses the surface normal direction; and wherein the projecting portion has a boss section surrounding at least a part of a periphery of the insertion hole, and the chassis member further comprises a reinforcing ring surrounding an outer peripheral surface of the boss section; and and wherein the reinforced fiber extends along at least a longitudinal direction of the one side.

5. The electronic device according to claim 4, further comprising:

a display on a front face of the chassis; and a keyboard on the second chassis, wherein the chassis has a back face that includes the face plate and a side face of the frame.

* * * * *